United States Patent [19]

Morita

[11] Patent Number: 5,233,745
[45] Date of Patent: Aug. 10, 1993

[54] ELECTRONIC-COMPONENT MOUNTING APPARATUS WITH MONITORING DEVICE

[75] Inventor: Takeshi Morita, Fukuoka, Japan

[73] Assignee: Matsushita Electric Industrial Co., Ltd., Osaka, Japan

[21] Appl. No.: 844,227

[22] Filed: Mar. 2, 1992

[30] Foreign Application Priority Data

Mar. 4, 1991 [JP] Japan ................................. 3-037247

[51] Int. Cl.$^5$ ............................................... H05K 3/30
[52] U.S. Cl. .......................................... 29/705; 29/740; 29/743; 29/833
[58] Field of Search ................. 29/720, 721, 705, 740, 29/741, 833, 743

[56] References Cited

U.S. PATENT DOCUMENTS 5,115,559  5/1992  Oyama .................................. 29/720

*Primary Examiner*—Carl E. Hall
*Attorney, Agent, or Firm*—Pollock, VandeSande & Priddy

[57] ABSTRACT

An apparatus for mounting electronic components on a circuit board, the apparatus being equipped with an X-Y table assembly moveable in a horizontal plane and monitoring device attached to the X-Y table assembly. An electronic component picking and mounting head is attached to the X-Y table assembly so as to be movable in accordance with the movement thereof and also arranged to be moveable vertically with respect to a lower surface of the X-Y table assembly. The head includes a rotating shaft disposed to be substantially parallel to the X-Y table assembly rotatable about its own axis and at least two nozzles attached to the rotating shaft so as to be rotatable in accordance with the rotation thereof. The nozzles are coupled to an external vacuum device so as to allow a suction of the electronic component and allow it to be carried toward the circuit board, and positioned so that one of the nozzles can face the monitoring device by rotation of the rotating shaft so as to allow the monitoring device to monitor the electronic component picked up by the nozzle. This arrangement permits the electronic component to be effectively mounted on the circuit board in a relative short time.

5 Claims, 4 Drawing Sheets

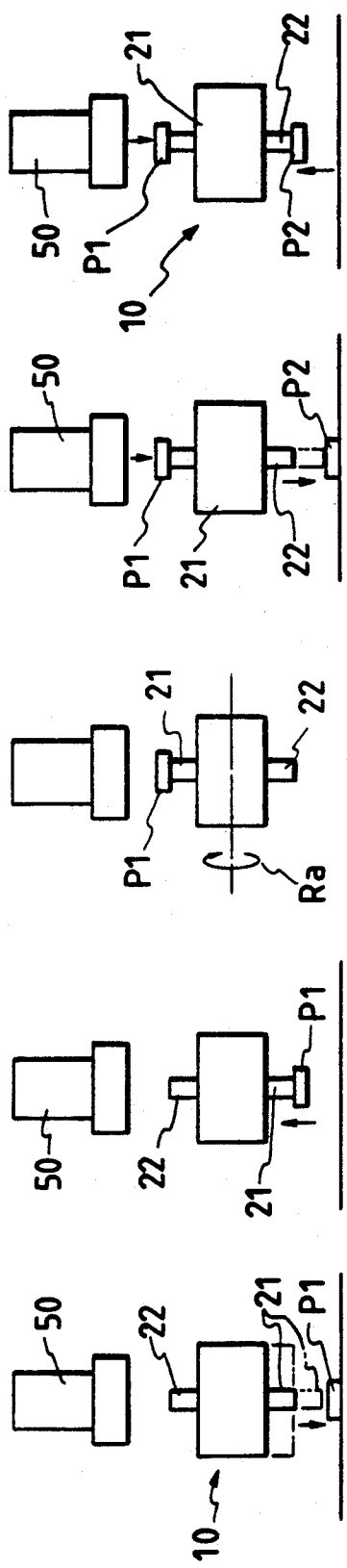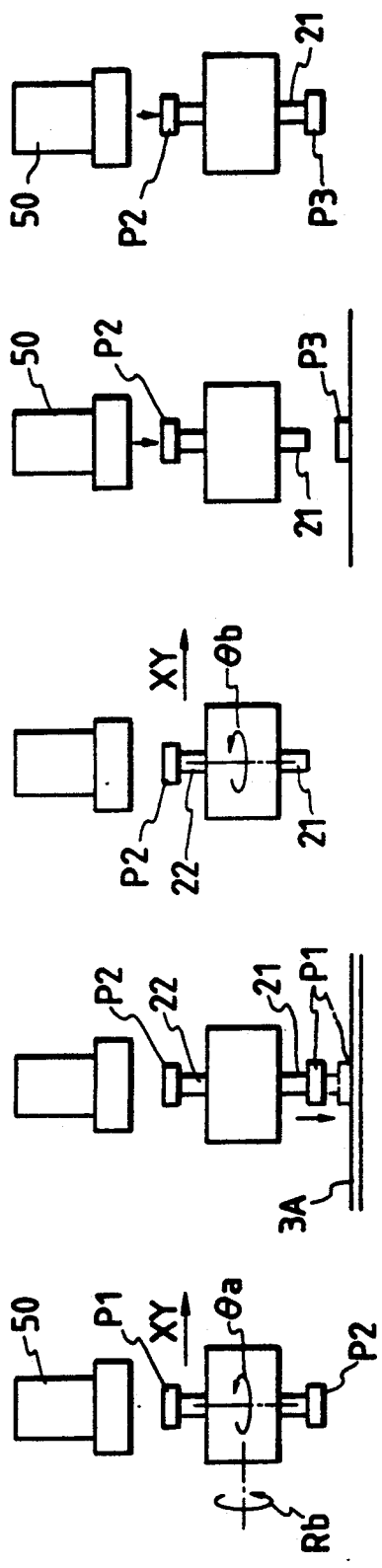

ELECTRONIC-COMPONENT MOUNTING APPARATUS WITH MONITORING DEVICE

BACKGROUND OF THE INVENTION

The present invention relates generally to electronic-component mounting apparatus, and more particularly to such an apparatus arranged to mount electronic components on a circuit board under observation by a monitoring device.

Conventionally, mounting apparatus of types as is known in the art are arranged such that an electronic component encased in a component feeder such as a tray are picked up by a suction nozzle of a picking and mounting head and then mounted on a circuit board after correction of two-dimensionally deviation (divergence, shifting) from the normal position. FIG. 1 shows an arrangement of a conventional mounting apparatus. In FIG. 1, on a base illustrated at numeral 1 there is disposed a board positioning section 4 coupled to a conveyor belt 5 of a conveying device, not shown, so that a circuit board 3 is introduced through the conveyor belt 5 into the board positioning section 4 to be positioned and then discharged therefrom. At a side of the board positioning section 4 there is disposed a table 7 for placing a component feeder 6 which encases various types of electronic components such as transistors and resistors P. Further, at a side of the table 7 there is disposed a monitoring device 100 equipped with a stage 101 and camera 102. In addition, above the base 1 there is disposed an X-Y table assembly 8 comprising an X-axis table 8a movable in directions along an X axis and a Y-axis table 8b movable in directions along a Y axis, the X and Y axes being on a horizontal plane and one of the X-axis directions being coincident with the direction that the circuit board 3 is carried through the conveyer belt 5. Designated at numeral 103 is a picking and mounting head which is placed on the Y-axis table 8b and which is equipped with a nozzle 104 for picking up electronic component.

In operation, in accordance with the movement of the X-Y table assembly 8, the picking and mounting head 103 is moved up to a position above the component feeder 6 as indicated by an arrow N1 so that the electronic component P is sucked and picked up by the nozzle 104. Secondly, the picking and mounting head 103 is moved to above the stage 101 as indicated by an arrow N2 so that the camera 102 checks the positional deviations of the electronic component P in the directions X, Y and θ (θ is a direction of rotation of the electronic component on the horizontal plane about its own axis). Here, the positional deviations of the electronic component P in the directions X and Y are corrected by adjusting the strokes of the picking and mounting head 103 in the directions X and Y through the X-Y table assembly 8 and the positional deviation thereof in the direction θ is corrected by rotating the nozzle 104 about the axis of the nozzle 104 by means of a motor, not shown, which is encased in the picking and mounting head 103. Furthermore, the picking and mounting head 103 is moved to above the circuit board 3 as indicated by an arrow N3 so as to mount the electronic component P at a predetermined position of the circuit board 3.

However, the conventional mounting apparatus provides a problem that the moving distance of the picking and mounting head 103 between the component feeder 6 and the circuit board 3 becomes long so that the cycle time becomes long, thereby lowering the working efficiency.

SUMMARY OF THE INVENTION

It is therefore an object of the present invention to provide an electronic-component mounting apparatus which is capable of speedily mounting an electronic component on a circuit board for a relatively short time.

An electronic-component mounting apparatus according to the present invention is equipped with table means movable on a horizontal plane, monitoring means attached to the table means so as to be movable in accordance with the movement of the table means, the monitoring means being arranged to monitor a state of each of the electronic component to be mounted on the circuit board, and head means attached to the table means so as to be movable in accordance with the movement of the table means, and arranged to be movable vertically with respect to a lower surface of the table means. The head means includes a rotating shaft disposed below the monitoring means to be substantially parallel to the lower surface of the table means and rotatable about its own axis, and nozzle means attached to the rotating shaft so as to be rotatable in accordance with the rotation of the rotating shaft. The nozzle means is coupled through passage means to an external vacuum device so as to allow a suction of each of the electronic components and allows it to be carried toward the circuit board in accordance with the movement of the table means, and further the nozzle means is positioned so that an extension of an axis of the nozzle means directs to the monitoring means when the rotating shaft is rotated by a predetermined angle so as to allow the monitoring means to monitor the electronic component sucked by the nozzle means.

Preferably, the nozzle means comprises at least two nozzles whose axes are coincident with each other and, when the rotating shaft is rotated by the predetermined angle, one of the two nozzles is positioned to face the electronic component and the other nozzle is positioned to face the monitoring means so that the monitoring means monitors the electronic component sucked by the other nozzle when the one nozzle sucks the next electronic component.

BRIEF DESCRIPTION OF THE DRAWINGS

The object and features of the present invention will become more readily apparent from the following detailed description of the preferred embodiments taken in conjunction with the accompanying drawings in which:

FIG. 4 is an illustration for describing operations of the electronic-component mounting apparatus according to the embodiment of this invention.

DETAILED DESCRIPTION OF THE INVENTION

Figure 2:
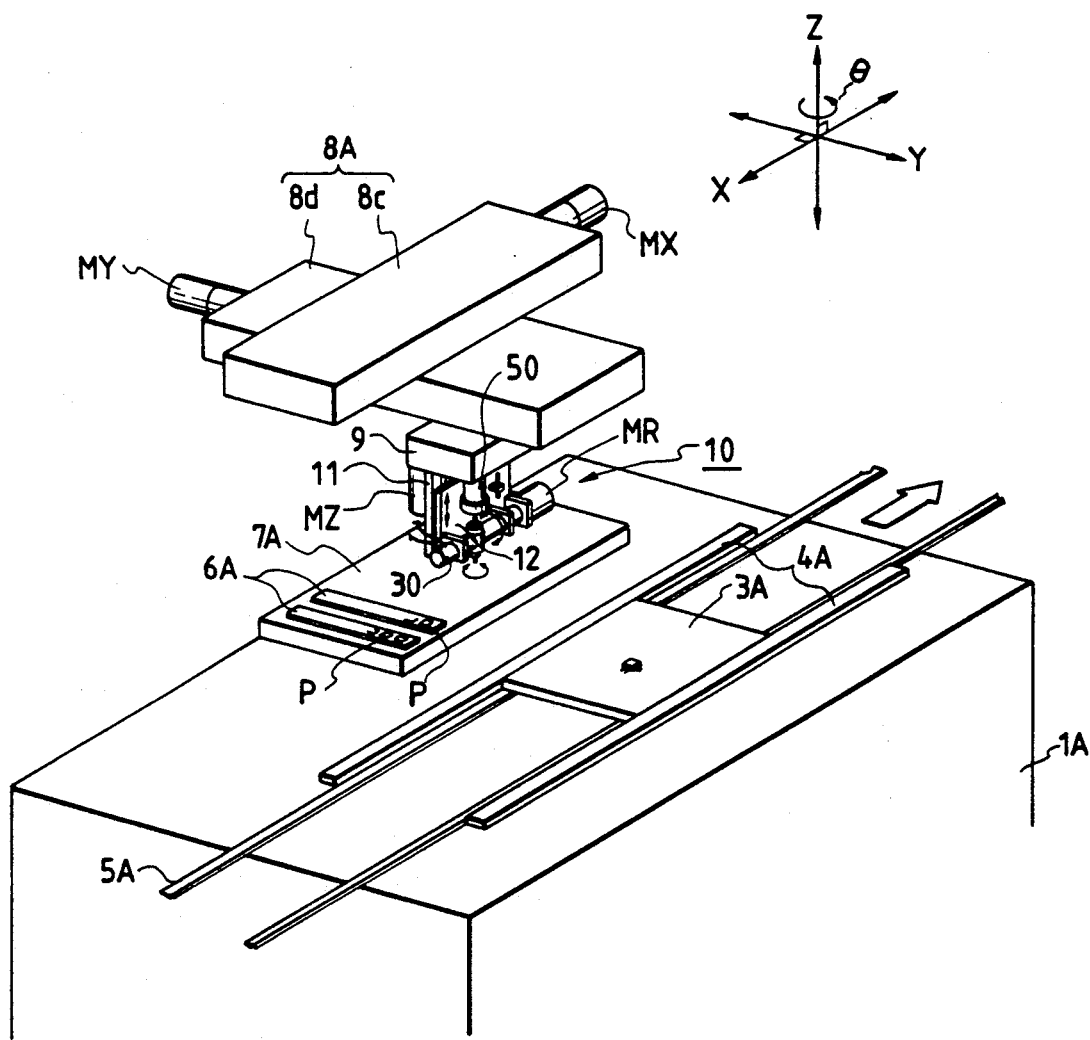
FIG. 2 is a perspective view showing an arrangement of an electronic-component mounting apparatus according to an embodiment of the present invention.

Referring now to FIG. 2, there is illustrated an arrangement of an electronic-component mounting apparatus according to an embodiment of the present invention. In FIG. 2, on a box-like base 1A there is placed a board-positioning section 4A coupled to a conveyer belt 5A of a conveyer device (not shown) so that a circuit board 3A fed through the conveyer belt 5A is clamped and positioned by the board-positioning section 4A and then discharged therefrom. At a side of the positioning section 4A there is disposed a component table 7A having on its surface a component feeder 6A such as a tray and a tape feeder which accommodates various types of electronic components P. Above the base 1A there is disposed an X-Y table assembly 8A comprising an X table 8c and a Y table 8d, the X table 8c being movable in X-axis directions on a horizontal plane by means of a table motor MX and the Y table 8d being movable in Y-axis direction perpendicular to the X directions on the same horizontal plane by means of a table motor MY. As a result, the X-Y table assembly 8A is arranged to be movable in the X-axis and Y-axis directions through operations of the table motors MX and MY. One of X-axis directions is coincident with the direction that the circuit board 3A fed due to the conveyer belt 5A.

To an end portion of the Y table 8d there is disposed a picking and mounting head 10 which is movable between the component feeder 6A and the circuit board 3A for picking up the electronic component P and mounting it on the circuit board 3A. The picking and mounting head 10 includes an installing block 9 whereby it is attached to a lower surface of the Y table 8d to be directed downwardly.

Figure 3A:
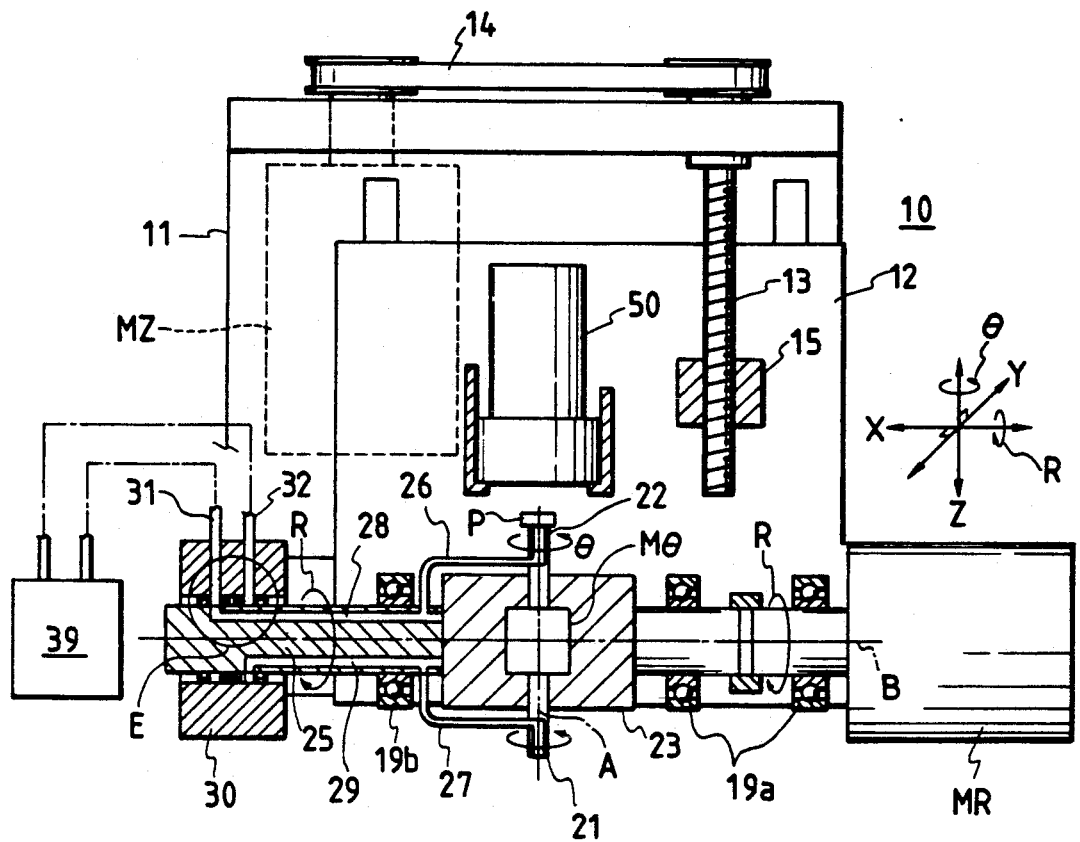
FIG. 3A is a cross-sectional view showing a picking and mounting head to be used in the FIG. 2 electronic-component mounting apparatus.

FIG. 3A is a cross-sectional view showing an arrangement of the picking and mounting head 10. In FIG. 3A, illustrated at numeral 11 is a supporting frame attached to the installing block 9. On the back surface of the supporting frame 11 there is placed a drive motor MZ, and to the front surface of the supporting frame 11 there is attached a bracket 12. To the bracket 12 there is fixedly secured a nut 15 which is engaged with a screw bar 13 extending vertically. A rotating shaft of the drive motor MZ is coupled through a timing belt 14 to one end portion of the screw bar 13 so that the screw bar 13 rotates in accordance with rotation of the drive motor MZ so as to move the bracket 12 upwardly and downwardly.

In addition, a motor MR is fixedly secured to one end portion of the bracket 12 having a rotating shaft 25 which extends horizontally up to a position beyond the other end portion of the bracket 12. The distal portion of the rotating shaft 25 of the motor MR is inserted into a cylindrical through-hole of a cylindrical member 30. At a substantial center portion of the rotating shaft 25 there is coaxially disposed a nozzle-holding member 23. Further, the rotating shaft 25 is supported by two bearings 19a between the motor MR and the nozzle-holding member 23 and also supported by a bearing 19b between the cylindrical member 30 and the nozzle-holding member 23. At the inside of the nozzle-holding member 23 there is encased a motor $M\theta$ having two rotating shafts which extend to be protruded from the nozzle-holding member 23 in directions reverse to each other. At the distal portions of the two rotating shafts of the motor $M\theta$ there are respectively formed nozzles 21 and 22 whose axes A are substantially perpendicular to the axis B of the rotating shaft 25 of the motor MR. The nozzles 21 and 22 are respectively rotatable about the axes A in a direction $\theta$ in response to rotation of the motor $M\theta$.

Figure 3B:
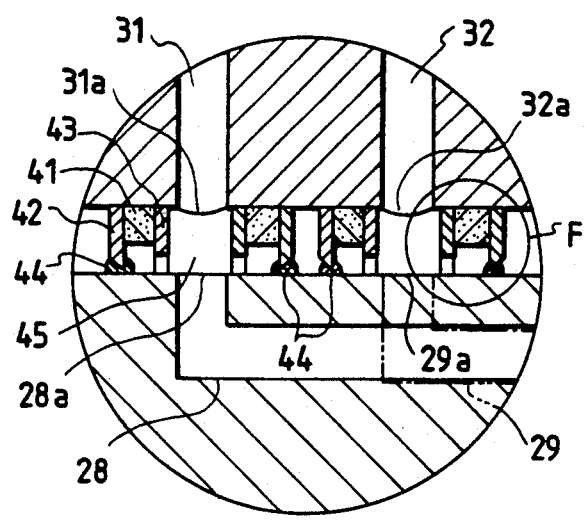
FIGS. 3B and 3C are enlarged illustrations of portions of the picking and mounting head shown in FIG. 3A.

The nozzles 21 and 22 are respectively coupled to one end portions of flexible pipes 26 and 27, the other end portions of which are respectively coupled to suction passages 28 and 29 formed within the rotating shaft 25 of the motor $M\theta$ so as to extend along the axis B of the rotating shaft 25 thereof. The rotating shaft 25 have on its outer circumference openings 28a and 29a respectively communicated with the suction passages 28 and 29, the openings 28a and 29a being respectively positioned to be opposed relations to one end portions (openings of the cylindrical member 30) 31a and 32a of pipes 31 and 32 formed to extend through the inside of the cylindrical member 30 up to the inner circumference thereof as illustrated in FIG. 3B which is an enlarged view showing a detailed arrangement of a portion indicated by character E in FIG. 3A. The other end portions of the pipes 31 and 32 are respectively connected to a suction device (vacuum device) designated at numeral 39. The openings 28a, 29a of the rotating shaft 25 and the openings 31a, 32a of the cylindrical member 30 are respectively communicated with each other through a sealing means which will be described hereinafter. Thus, this arrangement allows the nozzles 21 and 22 to suck the electronic component P in response to operation of the suction device 39 to pick up it from the component feeder 6A.

In FIG. 3B, at the vicinity of the openings 31a and 32a of the pipes 31 and 32 formed within the cylindrical member 30 and between the rotating shaft 25 and the cylindrical member 30 there are provided four circular permanent magnets 41, which are successively arranged along the axis B of the rotating shaft 25 and, at their outer circumferential portions, fixed to the inner circumference of the cylindrical member 30 so as to be coaxial with respect to the cylindrical member 30. The four permanent magnets 41 are paired so that each of the openings 31a and 32a is interposed between each of the pairs of permanent magnets 41. Further, between the rotating shaft 25 and the cylindrical member 30 there are coaxially provided four circular rings 43, which are successively arranged along the axis B of the rotating shaft 25 and, at its their outer circumferential portions, fixed to the inner circumference of the cylindrical member 30. Similarly, the four circular rings 43 are paired and disposed at the inner sides of the permanent magnets 41 with respect to the openings 31a and 32a so as to form passages 45 for respectively establishing the communications between the openings 28a, 29a of the rotating shaft 25 and the openings 31a, 32a of the cylindrical member 30. In addition, between the rotating shaft 25 and the cylindrical member 30 there are provided four circular rings 42 which are, at their outer circumferential portions, attached to the inner circumference of the cylindrical member 30 and positioned at the outer sides of the permanent magnets 41 with respect to the openings 31a and 32a so that each of the permanent magnets 41 is interposed between each of the circular rings 43 and each of the circular rings 42. With the above-described arrangement, the nozzles 21 and 22 can always suck the electronic components irrespective of rotation of the nozzles 21, 22 (head 10).

Figure 3C:
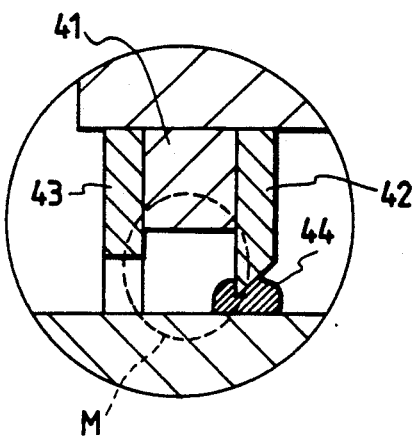

FIG. 3C is an enlarged view showing a portion (including one of the permanent magnets 41, one of the circular rings 42 and one of the circular rings 43) indicated by character F in FIG. 3B. In FIG. 3C, the inner circumferences of the circular rings 42 and 43 are arranged to be separated from the outer circumference of the rotating shaft 25. The inner circumferential portion of the circular ring 42 is tapered with an angle. As illustrated in FIG. 3C, this tapering is made by obliquely cutting a portion which is at the opposite side with respect to the ring 43. Between the inner circumferential portion of the circular ring 42 and the outer circumference of the rotating shaft 25 there is provided a magnetic liquid 44, which fills up a clearance therebetween. This magnetic liquid 44 forms a magnetic path from the permanent magnet 41 through the circular ring 42 and the rotating shaft 25 to the circular ring 43 as indicated by character M in FIG. 3C. The magnetic liquid 44 is concentrated and attached to the inner circumferential portion of the circular ring 42 due to the magnetic force to thereby seal the gap between the rotating shaft 25 and the cylindrical member 30. That is, the magnetic liquid 44 acts as the above-mentioned sealing means. Thus, irrespective of the rotation of the rotating shaft 25 in the direction indicated by character R, the magnetic liquid 44 can keep the airtightness of the passage 45 formed between the cylindrical member 30 and the rotating shaft 25. Although it is possible to use a mechanical packing such as an O-shaped ring in place of the magnetic liquid 44, the magnetic liquid 44 can effectively attenuate the vibration of the rotating shaft 25 which can occur at the time of the stopping of the rotation thereof, and can control the attenuating degree by selecting its viscosity. In addition, the attenuation function of the magnetic liquid 44 does not vary with the passage of time.

Returning again to FIG. 3A, designated at numeral 50 is a camera which acts as a monitoring device to check the positional deviations of the electronic component P, picked up by the nozzles 21 and 22, in the directions X, Y and $\theta$.

Figure 1:
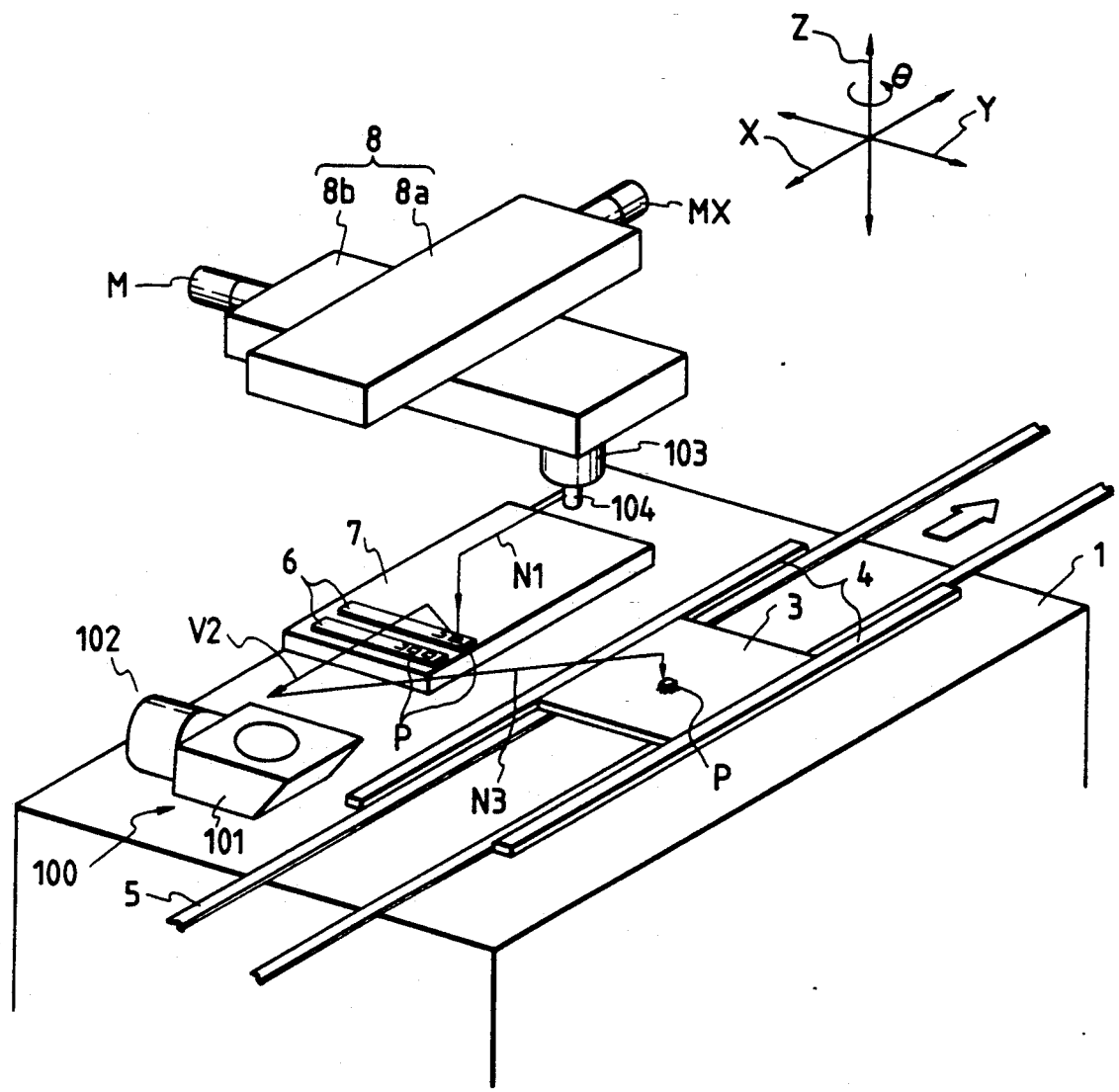
FIG. 1 is a perspective view showing an arrangement of a conventional electronic-component mounting apparatus.

Secondly, a description will be made hereinbelow with reference to FIGS. 1 and 4 in terms of the operation of the electronic-component mounting apparatus thus arranged. In FIGS. 1 and 4, the picking and mounting head 10 is first moved toward a position above the component feeder 6A in accordance with the movement of the X-Y table assembly 8A due to the operations of the table motors MX and MY. In response to reaching the position above the component feeder 6A, the motor MZ is operated to rotate to cause the picking and mounting head 10 to move downwardly due to the rotation of the screw bar 13 so that the distal portion of one nozzle (for example, 21) sucks the electronic component P1 as illustrated by (a) of FIG. 4. After the suction of the electronic component P1, the motor MZ is rotated in the reverse direction so as to cause the picking and mounting head 10 to move upwardly to pick up the electronic component P1 as indicated by (b) of FIG. 4. Here, the motor MR is rotated so that the nozzles 21 and 22 rotate by an angle of 180° about the axis B of the rotating shaft 25 of the motor MR in a direction Ra so as to turn over as illustrated by (c) of FIG. 4. When the nozzles 21 and 22 turn over, the electronic component P1 reaches the monitoring position so as to be monitored by the camera 50. Further, the X-Y table assembly 8A is operated so that the picking and mounting head 10 moves up to a position above the component feeder 6A, and the motor MZ is rotated so that the picking and mounting head 10 moves downwardly toward the next electronic component P2 as shown by (d) of FIG. 4. After the picking and mounting head 10 sucks the electronic component P2 by means of the other nozzle 22, the motor MZ is rotated in the reverse direction so as to cause the picking and mounting head 10 to move upwardly to pick up the electronic component P2 as indicated by (e) of FIG. 4. Here, during the picking-up of the electronic component P2, the camera 50 monitors the electronic component P1 previously picked up by the nozzle P1 so as to detect the positional deviations of the electronic component P1 in the directions X, Y and $\theta$. The camera 50 can monitor the electronic component P1 when the nozzles 21 and 22 turn as indicated (c) of FIG. 4.

Thereafter, with the X and Y tables $8a$ and $8d$ being driven, the picking and mounting head 10 starts to move toward the circuit board 3A placed at the positioning section 4A. At this time, the motor MR is rotated in the reverse direction Rb so that the nozzles 21 and 22 rotate in accordance with the rotation of the rotating shaft 25 in the direction Ra so as to again turn over, and at the same time the motor M$\theta$ is rotated in a direction $\theta$a as indicated by (f) of FIG. 3 to thereby correct the positional deviation of the electronic component P1 in the direction $\theta$. After reaching a position above the circuit board 3A in accordance with the operations of the table motors MX and MY, the motor MZ is rotated so that the picking and mounting head 10 moves downwardly to take an adequate stroke whereby the electronic component P1 is mounted on the circuit board 3A as illustrated by (g) of FIG. 4. Here, when the electronic component P2 is at the position that allows the monitoring by the camera 50, it is possible to monitor the electronic component P2 at that stage.

Furthermore, the motor MZ is rotated in the reverse direction so that the picking and mounting head 10 moves upwardly and the X-Y table assembly 8A then returns toward a position above the component feeder 6A in order to pick up the third electronic component P3. At this time, the motor M$\theta$ is simultaneously rotated so that the nozzles 21 and 22 rotate in the direction $\theta$b reverse to the direction $\theta$a so as to initialize the position of the nozzles 21 and 22 in the direction $\theta$ as shown by (h) of FIG. 4. Thereafter, as illustrated by (i) and (j) of FIG. 4, the picking and mounting head 10 moves up to the feeder 6A and then moves downwardly to pick up the electronic component P3. At this time, the camera 50 checks the positional deviations of the electronic component P2 in the directions X, Y and $\theta$, and the positional deviations thereof are corrected as described above, before the electronic component P2 is also mounted on the circuit board 3A. Similarly, after the nozzle 21 sucks the electronic component P1 and then rotates so that the nozzle 22 sucks the electronic component P2 and again rotates so that the nozzle 21 mounts the electronic component P1 at the mounting position, while the nozzle 21 moves to pick up a third electronic component P3, it is possible that the camera 50 monitors the electronic component P2 sucked by the nozzle 22 (see (h) of FIG. 4).

As described above, according to the above-described arrangement, due to the rotation by a predetermined angle, one of the two nozzles 21 and 22 is positioned to face the electronic component and the other nozzle is positioned to face the monitoring means so that the camera 50 can monitor the electronic component sucked by the other nozzle when the one nozzle sucks the next electronic component.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. An apparatus for mounting electronic components on a circuit board, said apparatus comprising:
   table means movable in a horizontal plane;
   monitoring means attached to said table means so as to be movable in accordance with the movement of said table means, said monitoring means being arranged to monitor a state of each electronic component to be mounted on said circuit board;
   head means attached to said table means so as to be movable in accordance with the movement of said table means, and arranged to be movable vertically with respect to a lower surface of said table means, said head means including—
   a rotating shaft disposed below said monitoring means to be substantially parallel to said lower surface of said table means and rotatable about its own axis;
   nozzle means attached to said rotating shaft so as to be rotatable in accordance with the rotation of said rotating shaft, said nozzle means being coupled through passage means to an external vacuum device so as to allow a suction of each of said electronic components and allow it to be carried toward said circuit board in accordance with the movement of said table means, and said nozzle means being positioned so that an extension of an axis of said nozzle means faces said monitoring means when said rotating shaft is rotated by a predetermined angle so as to allow said monitoring means to monitor said electronic component sucked by said nozzle means.

2. An apparatus as claimed in claim 1, wherein said nozzle means comprises at least two nozzles whose axes are coincident with each other.

3. An apparatus as claimed in claim 2, wherein, when said rotating shaft is rotated by said predetermined angle, one of said two nozzles is positioned to face said electronic component and the other nozzle is positioned to face said monitoring means so that said monitoring means monitors said electronic component sucked by the other nozzle when said one nozzle sucks the next electronic component.

4. An apparatus as claimed in claim 1, wherein said passage means comprises a first passage formed within said rotating shaft and a second passage formed within a cylindrical member into which said rotating shaft is inserted coaxially, said first and second passages being coupled to each other through sealing means comprising circular magnet means and circular ring means which are fixedly attached to an inner circumferential portion of said cylindrical member so as to be coaxially provided between said rotating shaft and said cylindrical member.

5. An apparatus as claimed in claim 4, wherein a portion of said circular ring means which is at the rotating shaft side is arranged to have a cross section tapered toward said rotating shaft, and a magnetic liquid which is responsive to a magnetic force due to said circular magnet means is provided between said portion thereof and said rotating shaft so that said first and second passages are airtightly coupled to each other.

* * * * *